United States Patent [19]

Jones

[11] Patent Number: 5,830,530
[45] Date of Patent: Nov. 3, 1998

[54] CHEMICAL VAPOR DEPOSITION OF TIN OXIDE FILMS

[75] Inventor: Anthony C. Jones, Merseyside, Great Britain

[73] Assignee: Epichem Limited, Merseyside, Great Britain

[21] Appl. No.: 809,457

[22] PCT Filed: Oct. 23, 1995

[86] PCT No.: PCT/GB95/02504

§ 371 Date: Jun. 30, 1997

§ 102(e) Date: Jun. 30, 1997

[87] PCT Pub. No.: WO96/12831

PCT Pub. Date: May 2, 1996

[30] Foreign Application Priority Data

Oct. 22, 1994 [GB] United Kingdom ............... 9421335

[51] Int. Cl.⁶ .................... C23C 16/18; C23C 16/40
[52] U.S. Cl. .................... 427/248.1; 427/255.1; 427/255.2; 427/126.3; 427/314
[58] Field of Search ............... 427/255.2, 255.1, 427/248.1, 126.3, 314

[56] References Cited

U.S. PATENT DOCUMENTS

| | | | |
|---|---|---|---|
| 4,504,522 | 3/1985 | Kaiser et al. | 427/103 |
| 4,857,095 | 8/1989 | Brown | 65/60.3 |
| 4,865,883 | 9/1989 | Saitoh et al. | 427/255 |
| 5,004,490 | 4/1991 | Brown | 60/60.52 |
| 5,279,851 | 1/1994 | Minosou et al. | 427/126 |
| 5,389,401 | 2/1995 | Gordon | 427/255.2 |

FOREIGN PATENT DOCUMENTS

| | | |
|---|---|---|
| 0 186 481 | 7/1986 | European Pat. Off. . |
| 0 261 578 | 3/1988 | European Pat. Off. . |
| 0 460 254 | 12/1991 | European Pat. Off. . |
| 2 103 592 | 2/1983 | United Kingdom . |

OTHER PUBLICATIONS

Pierson, "Handbook of Chemical Vapor deposition (CVD), Principles, Technology and Applications", Noyes Publications, 1992, pp. 235–236.

Houlton et al, Chem. Vap. Deposition (1995), 1(1), 26–8.

*Primary Examiner*—Roy V. King
*Attorney, Agent, or Firm*—Seidel, Gonda, Lavorgna & Monaco, PC

[57] ABSTRACT

A method of depositing a tin oxide film onto a heated substrate is provided, by chemical vapor deposition using a tetraalkyoxy tin compound. Further provided is a method for doping the film with platinum or palladium using a β-diketonate precursor thereof.

12 Claims, No Drawings

CHEMICAL VAPOR DEPOSITION OF TIN OXIDE FILMS

FIELD OF THE INVENTION

This invention concerns chemical vapour deposition of tin oxide.

BACKGROUND OF THE INVENTION

The metal oxide semi-conductor tin oxide ($SnO_2$) has a range of important applications, such as in transparent and conducting coatings on glass and in gas-sensing devices, especially for carbon monoxide, used in environmental and automotive applications.

Tin oxide gas sensors have been prepared from bulk sintered powder or from deposited thick or thin films. Thin films of tin oxide are especially suitable for gas-sensor applications, due to their better speed of response compared to thick films. Also, they can be fabricated with small dimensions on a large scale using low-cost production techniques. Also, thin films are widely compatible with existing micro-electronics technology and integrated circuits.

Thin films of tin oxide have been grown by a variety of techniques including reactive sputtering, spray pyrolysis and chemical vapour deposition (CVD). Of these techniques CVD has considerable potential due to its capability for large area growth, control of doping and film thickness and superior conformal step coverage.

A variety of precursors have been used for the deposition of tin oxide by CVD, including stannic chloride ($SnCl_4$) and organotin compounds, such as dibutyltin diacetate ($Bu_2Sn(OAc)_2$), dimethyltin dichloride ($Me_2SnCl_2$) and tetramethyltin ($Me_4Sn$). These precursors are generally highly toxic volatile materials, which are hazardous to use, and metal oxide growth is only possible in the presence of a large excess of a separate added oxidant, such as oxygen or water.

For example, U.S. Pat. No. 4,865,883 (Saitoh et al) relates to a method for forming a deposited film by introducing a gaseous starting material containing tin atoms, such as $SnH_4$ or $Sn(CH_3)_4$, a gaseous oxidizing agent to oxidize the starting material and an oxygen-containing gaseous compound for formation of a precursor for deposition of the film. U.S. Pat. No. 5,279,851 (Minosou et al) relates to a method of depositing a coating of stannic oxide containing potassium onto glass using the precursor, dioctyltin diacetate.

SUMMARY OF THE INVENTION

An object of this invention is, therefore, to provide a technique for depositing tin oxide which involves use of less hazardous source materials.

It has now been surprisingly found that tetraalkoxy tin compounds can be used to deposit tin oxide by chemical vapour deposition in the absence of an added oxygen source.

Accordingly in a first embodiment the invention provides a method of depositing tin oxide by chemical vapour deposition onto a heated substrate using a tetraalkyoxy tin compound.

The addition of dopants, such as platinum and palladium, to tin oxide films has been shown to improve the sensitivity and selectivity of gas sensor devices. It has further been surprisingly found that by including a β-diketonate of platinum or palladium in the chemical vapour deposition method using a tetraalkoxy tin compound can result in a platinum or palladium doped tin oxide film.

Accordingly in a second embodiment the invention provides a method of depositing a platinum or palladium doped tin oxide film on a heated substrate by chemical vapour deposition using a mixture of a tetraalkoxy tin compound and a platinum or palladium β-diketonate.

The invention further provides a substrate having a thin film of tin oxide doped with platinum deposited thereon by chemical vapour deposition from tetraalkoxy tin and a platinum β-diketonate as precursors, wherein the deposited film has reduced levels of carbon contamination.

The invention also provides a gas-sensor comprising a substrate having a film of platinum-doped tin oxide having low levels of carbon contamination deposited thereon produced by the method of the invention.

DESCRIPTION OF THE PREFERRED EMBODIMENTS

Preferred tin compounds for use in the invention included branched chain tetraalkoxy tin compounds, examples of which are tetratertiarybutoxy tin and tetraisopropoxy tin.

Preferred platinum or palladium compounds for use in the second embodiment of the invention include platinum acetylacetonate and palladium aceytlacetonate.

The substrate is preferably heated in the range 250°–400° C. for chemical vapour deposition according to the invention. The organometallic precursors are preferably delivered to the substrate in an inert carrier gas, such as nitrogen.

In carrying out the method of the second embodiment of the invention it is preferred that a thin film of tin oxide alone be deposited on the substrate before introduction of the platinum or palladium precursor.

This invention will now be further described by means of the following Examples

EXAMPLES 1 to 8

Tin oxide films were deposited from tetratertiary butoxy tin at either 1 Bar (760 Torr) or 0.0013 Bar (15 Torr) in a cold-wall horizontal quartz reactor using radiant substrate heating. The $Sn(OBu^t)_4$ source was contained in a glass bubbler using nitrogen as carrier gas. The source and reactor inlet lines were heated during metalorganic chemical vapour deposition (MOCVD) to prevent condensation of the precursor.

The substrates were soda lime glass which had been cleaned using 20% nitric acid/deionised water, degreased with acetone and dried before use.

The growth conditions are given in Table 1 below.

TABLE 1

Growth conditions to be used to deposit $SnO_2$ from $Sn(OBu^t)_4$

| | |
|---|---|
| (a) Cell pressure = 1 Bar (760 Torr) | |
| $Sn(OBu^t)_4$ source temperature | 80° C. |
| Reactor inlet line temperature | 100° C. |
| $N_2$ carrier gas flow | 75 SCCM |
| Total $N_2$ flow | 175 SCCM |
| Substrate | Soda lime glass |
| Deposition temperature | 250–400° C. |
| (b) Cell pressure = 0.0013 Bar (15 Torr) | |
| $Sn(OBu^t)_4$ source temperature | 45° C. |
| Reactor inlet line temperature | 70° C. |
| $N_2$ carrier gas flow | 25 SCCM |
| Substrate | Soda lime glass |
| Deposition temperature | 250–400° C. |

Thin films of tin oxide were deposited using $Sn(OBu^t)_4$, in the absence of added oxidant, over the temperature range 250°–400° C. at both atmospheric pressure and at a low pressure. The atomic compositions of the films deposited were determined by Auger electron specotrscopy (AES) and the results are shown in Table 2 below

TABLE 2

Auger electron spectral analysis of tin oxide films grown on glass substrate using $Sn(OBu^t)_4$ [a]

| Example No. | Substrate temperature | Atomic composition (atom %) | | O/Sn Ratio |
|---|---|---|---|---|
| | | Sn | O | |
| 1 | 250 | 35.8 | 64.2 | 1.8 |
| 2 | 300 | 38.5 | 61.5 | 1.6 |
| 3 | 350 | 49.6 | 60.4 | 1.5 |
| 4 | 400 | 38.5 | 61.1 | 1.6 |
| 5 | 250 | 35.0 | 65.0 | 1.9 |
| 6 | 300 | 37.4 | 62.6 | 1.7 |
| 7 | 250 | 35.6 | 64.4 | 1.8 |
| 8. | 400 | 34.7 | 65.3 | 1.9 |

[a]Film Nos. 1–4 grown at 1 Bar (760 Torr), films 5–8 frown at 0.0013 Bar (15 Torr).

This data indicates that the tin oxide films are non-stoichiometric and oxygen deficient with O/Sn ratios in the range of 1.5 to 1.9. The AES data further shows that carbon is substantially absent from the tin oxide films which indicates that a facile route exists for the removal of the organic radical of $Sn(OBu^t)_4$ as a volatile and non-reactive reaction product.

The tin oxide films were generally dark and slightly absorbing, possibly due to the presence of excess zinc, and analysis by X-ray diffraction indicated that the films were amorphous. Field electron microscopy (FEM) data for a film grown at 300° C. showed a granular surface morphology with a grain size <0.1 um.

EXAMPLES 9 to 11

Platinum containing tin oxide films were deposited by MOCVD at 0.0013 Bar (15 Torr) onto glass substrates using tetratertiarybutoxy tin and platinum acetyl acetonate with nitrogen as carrier gas. Prior to the introduction of platinum acetyl acetonate vapour, a thin layer of tin oxide was deposited using $Sn(OBu^t)_4$ alone as precursor. The growth conditions used are shown in Table 3 below.

TABLE 3

Growth conditions used to deposit Pt-containing $Sn(OBu^t)_4$ and $Pt(acac)_2$ [a]

| | Example 9 | Example 10 | Example 11 |
|---|---|---|---|
| $N_2$ flow through $Sn(OBu^t)_4$(SCCM) | 15 | 50 | 100 |
| $N_2$ flow through $Pt(acac)_2$(SCCM) | 50 | 50 | 50 |
| $SnO_2$ deposition time (min)[B] | 23 | 10 | 20 |
| $Pt/SnO_2$ deposition time (min) | 27 | 110 | 40 |

[a]Cell pressure = 0.0013 Bar (15 Torr); '$Sn(OBu^t)_4$ source temperature = 50° C.; $Pt(acac)_2$ source temperature = 100° C.; Reactor inlet lines = 120° C.
[b]Deposition time of initial $SnO_2$ layer prior to introduction of $PT(acac)_2$ vapour.

AES data for $SnO_2$ films containing Pt are given in Table 4 below.

TABLE 4

AES data Pt-containing $SnO_2$ films deposited on glass at 400° C. from $Sn(OBu^t)_4$ and $Pt(acac)_2$

| Example No. | Etch time (secs) | Atomic composition (atom %) | | | |
|---|---|---|---|---|---|
| | | Sn | O | Pt | C |
| 9 | 360 | 35.9 | 60.9 | 3.2 | 0.0 |
| 10 | 60 | 42.8 | 51.4 | 5.8 | 0.0 |
| | 120 | 42.1 | 45.9 | 12.0 | 0.0 |
| | 180 | 44.2 | 32.6 | 23.2 | 0.0 |
| 11 | 60 | 41.1 | 54.0 | 4.9 | 0.0 |

AES data for $SnO_2$ films containing Pt are given in Table 4. The AES data indicate that the $Pt(acac)_2$ prescursor has allowed the introduction of platinum upto 23.2 atom %. Such levels are useful in gas sensor applications.

It is significant that carbon is generally absent from the $SnO_2$ films containing Pt. This is a surprising result in view of the heavy carbon contamination (up to 50 wt %) previously observed in Pt films deposited by vacuum CVD using $Pt(acac)_2$. This advantageous result may prove to be extremely significant in commercial development of $Pt/SnO_2$ sensor materials, as $Pt(acac)_2$ is a readily available and relatively inexpensive Pt source.

In summary, the precursor $Sn(OBu^t)_4$ has proved to be a useful precursor for the deposition of $SnO_2$ by MOCVD at 250°–400° C., in the absence of an added oxidant. Furthermore, $Pt(acac)_2$ has been used successfully to introduce useful levels of Pt into $SnO_2$ films with little or no incorporation of carbon.

I claim:

1. A method for depositing a tin oxide film on a heated substrate by contacting the heated substrate with a tin oxide precursor comprising a tetraalkyoxy tin compound.

2. A method as claimed in claim 1, wherein the tetraalkyoxy tin compound is a branched chain tetraalkyoxy tin compound.

3. A method as claimed in claim 2, wherein the tetraalkyoxy tin compound is selected from the group consisting of tetratertiarybutoxy tin and tetraisopropoxy tin.

4. A method as claimed in claim 1, wherein a dopant is included in the tin oxide film.

5. A method as claimed in claim 4, wherein the dopant is selected from the group consisting of platinum compounds and palladium compounds.

6. A method as claimed in claim 5, wherein the dopant is a platinum β-diketonate or a palladium β-diketonate, and the deposited tin oxide film comprises a platinum-doped or palladium-doped tin oxide film.

7. A method as claimed in claim 6, wherein the dopant is selected from the group consisting of platinum acetylacetonate and palladium acetylacetonate.

8. A method as claimed in claim 1, wherein the substrate is heated in the range of 250°–400° C.

9. A method as claimed in claim 1, wherein the tin oxide precursor is delivered to the substrate by an inert carrier gas.

10. A method as claimed in claim 9, wherein the inert carrier gas is nitrogen.

11. A method of depositing a platinum- or palladium-doped tin oxide film on a heated substrate by contacting the heated substrate with a tetraalkyoxy tin compound and a dopant selected from the group consisting of a platinum β-diketonate and a palladium β-diketonate.

12. A method as claimed in claim 11, wherein a thin layer of tin oxide alone is deposited on the substrate before introduction of the dopant.

* * * * *